(12) United States Patent
Kubo et al.

(10) Patent No.: US 8,604,335 B2
(45) Date of Patent: Dec. 10, 2013

(54) LAMINATE FOR DYE-SENSITIZED SOLAR CELL, ELECTRODE FOR DYE-SENSITIZED SOLAR CELL AND METHOD FOR PRODUCING IT

(75) Inventors: Koji Kubo, Anpachi-gun (JP); Rei Nishio, Anpachi-gun (JP); Hiroshi Hara, Iwakuni (JP); Kei Mitzutani, Hino (JP)

(73) Assignees: Teijin Dupont Films Japan Limited, Tokyo (JP); Teijin Limited, Osaka (JP)

( * ) Notice: Subject to any disclaimer, the term of this patent is extended or adjusted under 35 U.S.C. 154(b) by 603 days.

(21) Appl. No.: 11/665,062

(22) PCT Filed: Oct. 13, 2005

(86) PCT No.: PCT/JP2005/019243
§ 371 (c)(1),
(2), (4) Date: Apr. 11, 2007

(87) PCT Pub. No.: WO2006/041199
PCT Pub. Date: Apr. 20, 2006

(65) Prior Publication Data
US 2009/0223559 A1   Sep. 10, 2009

(30) Foreign Application Priority Data

Oct. 13, 2004 (JP) ................................. 2004-298648
Oct. 27, 2004 (JP) ................................. 2004-312049

(51) Int. Cl.
H01L 31/00   (2006.01)
H01L 21/00   (2006.01)
B32B 27/06   (2006.01)

(52) U.S. Cl.
USPC ............. 136/256; 438/57; 438/608; 428/480

(58) Field of Classification Search
USPC ................ 136/243, 258, 263, 260, 264, 256; 257/292, 293; 428/480; 438/608, 57
See application file for complete search history.

(56) References Cited

U.S. PATENT DOCUMENTS

| 2001/0008710 | A1 | 7/2001 | Takatsuji et al. | |
| 2002/0115760 | A1* | 8/2002 | Murschall et al. | 524/128 |
| 2004/0163700 | A1* | 8/2004 | Mizuta et al. | 136/263 |
| 2004/0267006 | A1 | 12/2004 | Yamane et al. | |
| 2005/0260786 | A1 | 11/2005 | Yoshikawa et al. | |

FOREIGN PATENT DOCUMENTS

| EP | 1 717 897 | A1 | 11/2006 | | |
| JP | 62-196140 | | * 8/1987 | ............... | B32B 9/00 |
| JP | 2000-67657 | A | 3/2000 | | |
| JP | 2001-001441 | | * 1/2001 | ............... | B32B 7/02 |
| JP | 2001-1441 | A | 1/2001 | | |
| JP | 2001-240685 | A | 9/2001 | | |
| JP | 2002-353483 | A | 12/2002 | | |
| JP | 2003-31272 | A | 1/2003 | | |
| JP | 2003-297442 | A | 10/2003 | | |
| JP | 2003-297445 | A | 10/2003 | | |
| JP | 2003-298082 | A | 10/2003 | | |
| JP | 2003-308890 | A | 10/2003 | | |
| JP | 2003-338219 | A | 11/2003 | | |
| JP | 2004-118144 | A | 4/2004 | | |
| JP | 2004-119188 | A | 4/2004 | | |
| JP | 2004-165513 | A | 6/2004 | | |
| JP | 2004-195898 | A | 7/2004 | | |
| JP | 2004-235004 | A | 8/2004 | | |
| JP | 2004-265662 | A | 9/2004 | | |
| JP | 2004-276565 | A | 10/2004 | | |
| JP | 2005-251506 | A | 9/2005 | | |
| WO | 03/088273 | A1 | 10/2003 | | |
| WO | 2004-006292 | A2 | 1/2004 | | |
| WO | 2004/017452 | A1 | 2/2004 | | |
| WO | 2004/053196 | A1 | 6/2004 | | |
| WO | WO/2004/070737 | | * 8/2004 | ............... | B32B 7/12 |
| WO | 2005/074068 | A1 | 8/2005 | | |

OTHER PUBLICATIONS

Tominaga et al. "Conductive Transparent films deposited by simultaneous sputtering of zinc-oxide and indium-oxide targets" Vacuum 59 (2000) 546-552.*
Kotsubo et al. WO/2004/070737, Machine Translation, Aug. 2004.*
Hara, JP2003-338219 Machine Translation, Nov. 2003.*
EP Communication, dated Jun. 5, 2009, issued in corresponding EP Application No. 05795107.1, 6 pages.
Tominaga et al.; Conductive Transparent Films Deposited by Simultaneous Sputtering of Zinc-Oxide and Indium-Oxide Targets; Vacuum 59; (2000) 546-552.

* cited by examiner

*Primary Examiner* — Devina Pillay
(74) *Attorney, Agent, or Firm* — Sughrue Mion, PLLC

(57) ABSTRACT

A laminate for dye-sensitized solar cell comprising a plastic film of which the thermal shrinkage in the machine direction thereof when heat-treated at 200° C. for 10 minutes is from −1.5 to +0.5%, and a transparent conductive layer provided on the film, which comprises essentially indium oxide with zinc oxide added thereto and has a surface resistivity of at most 40 Ω/square, may give a highly-durable and flexible, dye-sensitized solar cells having high photovoltaic power generation efficiency.

11 Claims, No Drawings

LAMINATE FOR DYE-SENSITIZED SOLAR CELL, ELECTRODE FOR DYE-SENSITIZED SOLAR CELL AND METHOD FOR PRODUCING IT

TECHNICAL FIELD

The present invention relates to a laminate for dye-sensitized solar cells and an electrode for dye-sensitized solar cells. More precisely, the invention relates to a laminate for dye-sensitized solar cells, an electrode for dye-sensitized solar cells and a method for producing it, capable of producing highly-durable and flexible, dye-sensitized solar cells having high photovoltaic efficiency.

BACKGROUND ART

Since the proposal of a photoelectric conversion device that comprises dye-sensitized semiconductor particles (Nature, Vol. 353, pp. 737-740, 1991), a dye-sensitized solar cell is much noticed as a new solar cell substitutable for a silicon-based solar cell. In particular, a dye-sensitized solar cell comprising a plastic film as the support thereof is flexible and lightweight, and many investigations on it have been made.

DISCLOSURE OF THE INVENTION

An electrode for dye-sensitized solar cell comprises a support, a transparent conductive layer formed on it, and a semiconductor layer further formed on that layer. For adsorbing a larger amount of dye, a porous semiconductor layer is used, and the porous semiconductor layer is formed by sintering fine particles. For forming the porous semiconductor layer, semiconductor particles must be sintered; and for increasing the charge transportation efficiency of the layer, the particles must be sintered at a sufficiently high temperature. In a conventional electrode for dye-sensitized solar cell comprising a glass substrate, the particles could be sintered at a sufficiently high temperature, and an electrode having a high charge transportation efficiency can be formed. However, glass is heavy and is vulnerable to a shock, and the solar cell that comprises a glass support is limited in its installation condition.

A plastic film is inexpensive and is highly-transparent, and is therefore a material useful as a support. However, even when an ordinary plastic film is used as a support for electrodes for dye-sensitized solar cells, a porous semiconductor layer could not be sintered at a sufficiently high temperature. As a result, the charge transportation efficiency of the layer is low, and the photovoltaic power generation performance of the layer is extremely inferior to that of any others formed on a glass support.

A most popular material of a transparent conductive layer is an indium-tin composite oxide (ITO). When a plastic film is used as a support and when an ITO layer is provided on the plastic film support, then the behavior of the structure may differ from that of a structure having a glass support; namely, when the sintering temperature for a porous semiconductor layer to be formed on it is elevated, then the transparent conductive layer becomes an amorphous state or a mixed amorphous/crystalline state. Accordingly, the electrode that comprises a plastic film and ITO may undergo amorphous/crystalline phase transition in sintering a porous semiconductor layer thereon, whereby the mechanical properties of the electrode may be worsened and the electrode may be cracked; and as a result, when it is used as a support of dye-sensitized solar cells, then the photovoltaic power generation performance of the cells may worsen with time.

The present invention is to solve the problems with the prior art as above and to provide a laminate for dye-sensitized solar cell and an electrode for dye-sensitized solar cell capable of producing highly-durable and flexible, dye-sensitized solar cells that have high photovoltaic power generation efficiency and are free from a problem of time-dependent photovoltaic power generation performance degradation.

Specifically, the invention is a laminate for dye-sensitized solar cell comprising a plastic film of which the thermal shrinkage in the machine direction thereof when heat-treated at 200° C. for 10 minutes is from −1.5 to +0.5%, and a transparent conductive layer provided on the film, which comprises essentially indium oxide with zinc oxide added thereto and has a surface resistivity of at most 40 Ω/square.

The invention is also an electrode for dye-sensitized solar cell comprising the above laminate for dye-sensitized solar cell, and a porous semiconductor layer formed on the transparent conductive layer of the laminate and comprising at least one oxide selected from a group consisting of titanium oxide, zinc oxide and tin oxide.

The invention is also a method for producing an electrode for dye-sensitized solar cell, which comprises forming a porous semiconductor layer comprising at least one oxide selected from a group consisting of titanium oxide, zinc oxide and tin oxide, on the transparent conductive layer of the above laminate for dye-sensitized solar cell, and baking the porous semiconductor at a temperature of from 170 to 250° C.

BEST MODE FOR CARRYING OUT THE INVENTION

The invention is described in detail hereinunder.
(Plastic Film)

The plastic film in the invention is such that its thermal shrinkage in the machine direction thereof when heat-treated at 200° C. for 10 minutes is from −1.5% to +0.5%, preferably from −1.3% to +0.5%, more preferably from −1.3% to +0.3%. When the thermal shrinkage of the film oversteps the above range, then the laminate may curl, the adhesiveness between the transparent conductive layer and the porous semiconductor layer may worsen, and the dye-sensitized solar cell fabricated could not exhibit a sufficient photovoltaic power generation performance.

When heat-treated at 230° C. for 10 minutes, the plastic film in the invention is such that its thermal shrinkage in the machine direction thereof is preferably from −2.0 to +2.0%, more preferably from −1.5% to +2.0%, even more preferably from −1.5% to +1.5%. When the thermal shrinkage of the film oversteps the above range, then it is unfavorable since the laminate may curl, the adhesiveness between the transparent conductive layer and the porous semiconductor layer may worsen, and the dye-sensitized solar cell fabricated could not exhibit a sufficient photovoltaic power generation performance.

[Haze]

The haze of the plastic film in the invention is preferably at most 1.5%, more preferably at most 1.0%, even more preferably at most 0.5% from the viewpoint of more efficient photovoltaic power generation performance of the cell. When the haze is over 1.5%, then it is unfavorable since the photovoltaic power generation performance of the cell may lower.

[Linear Expansion Coefficient]

The linear expansion coefficient of the plastic film in the invention is preferably at most 100 ppm/° C., more preferably at most 70 ppm/° C. When the linear expansion coefficient is more than 100 ppm/° C., then it is unfavorable since the transparent conductive layer formed on the plastic film may be broken and the function of the electrode may lower.

[Haze Change]

The haze change of the plastic film in the invention, when heated at a temperature of 150° C. for 10 minutes, is preferably at most 5%, more preferably at most 2%. When the haze change is more than 5%, then it is unfavorable since a uniform transparent conductive layer could not be formed on the film and since the photovoltaic power generation efficiency of the electrode formed may lower.

[Particles]

Preferably, the plastic film in the invention does not substantially contain particles or fine particles. When it contains particles or fine particles, then its high transparency may lower or its surface may roughen therefore resulting in that a transparent conductive layer may be difficult to form thereon.

[Surface Roughness]

The three-dimensional center-line average height of the plastic film in the invention is preferably from 0.0001 to 0.02 µm, more preferably from 0.0001 to 0.015 µm, even more preferably from 0.0001 to 0.010 µm on both surfaces thereof. In particular, it is desirable that the three-dimensional center-line average height of at least one surface of the film is 0.0001 to 0.005 µm, more preferably from 0.0005 to 0.004 µm for further facilitating the formation of a transparent conductive layer on the film.

[Film Thickness]

The thickness of the plastic film in the invention is preferably from 10 to 500 µm, more preferably from 20 to 400 µm, even more preferably from 50 to 300 µm. Within the range, the film may give strong and flexible laminate and electrode for dye-sensitized solar cell.

[Plastic Film]

The plastic film having the above properties for use herein includes, for example, polyester, polycarbonate, polysulfone, polyether sulfone and amorphous polyolefin films. Of those, preferred are polyester films and polycarbonate films; and more preferred are polyester films.

[Polyester]

Use of a polyester film as the plastic film is described in detail hereinunder.

The polyester to constitute a polyester film is a linear saturated polyester to be produced from an aromatic dibasic acid or its ester-forming derivative and a diol or its ester-forming derivative. Of such polyesters, preferred are polyethylene terephthalate and polyethylene-2,6-naphthalate as their balance of mechanical properties and optical properties is good. In particular, polyethylene-2,6-naphthalate is the most favorable as it is superior to polyethylene terephthalate in that its mechanical strength is high, its thermal shrinkage is small and it gives few oligomers when heated.

The polyester may be a homopolymer or a copolymer. When it is a copolymer, its copolymerization ratio is preferably at most 10 mol %, more preferably at most 5 mol %, even more preferably at most 3 mol %. Especially preferred is a homopolymer.

When a copolymer is used, the comonomer component to constitute the copolymer may be a compound having two ester-forming functional groups in the molecule. The compound includes, for example, dicarboxylic acids such as oxalic acid, adipic acid, phthalic acid, sebacic acid, dodecanedicarboxylic acid, isophthalic acid, terephthalic acid, 1,4-cyclohexanedicarboxylic acid, 4,4'-diphenyldicarboxylic acid, phenylindanedicarboxylic acid, 2,7-naphthalenedicarboxylicacid, tetralindicarboxylic acid, decalindicarboxylic acid, diphenylether-dicarboxylic acid: hydroxycarboxylic acids such as p-hydroxybenzoic acid, p-hydroxyethoxybenzoic acid; and dialcohols such as propylene glycol, trimethylene glycol, tetramethylene glycol, hexamethylene glycol, cyclohexanedimethylene glycol, neopentyl glycol, bisphenol sulfone ethylene oxide adduct, bisphenol A ethylene oxide adduct, diethylene glycol, polyethylene glycol. One or more of these compounds may be used herein.

The polyester may be produced in any conventional known method. For example, herein employable is a method of directly producing a low-polymerization-degree polyester through reaction of a dicarboxylic acid and a glycol; and a method comprising reacting a lower alkyl ester of a dicarboxylic acid with a glycol by the use of an interesterification catalyst, followed by polymerizing it in the presence of a polymerization catalyst. In the case where the polymer is produced through polymerization via interesterification, a phosphorus compound such as trimethyl phosphate, triethyl phosphate, tri-n-butyl phosphate or orthophosphoric acid is generally added to the system for the purpose of inactivating the interesterification catalyst before the step of polymerization, but the phosphorus element content of the polyester is preferably from 20 to 100 ppm in view of the thermal stability of the polyester.

The polyester may be, after formed through melt polymerization, formed into chips and may be further subjected to solid-phase polymerization under heat under reduced pressure or in an inert atmosphere such as nitrogen.

The intrinsic viscosity of the polyester is preferably at least 0.40 dl/g, more preferably from 0.40 to 0.90 dl/g. When lower than 0.40 dl/g, it is unfavorable as increasing process-down frequency; but when larger than 0.90 dl/g, then it is also unfavorable since the melt viscosity of the polymer may be too high and the polymer may be difficult to work for melt extrusion, and the polymerization time may be long and uneconomical.

The polyester film to be used as the plastic film is preferably a biaxially-oriented film. It may be produced from the above-mentioned polyester, for example, according to the method mentioned below. The glass transition temperature is abbreviated as Tg.

First, a polyester is melt-extruded into a film, then cooled and solidified on a casting drum to give an unstretched film. The unstretched film is stretched in the machine direction at Tg to (Tg+60)° C., once or more to an overall draw ratio of from 3 to 6 times; and then this is stretched in the transverse direction at Tg to (Tg+60)° C. to a draw ratio of from 3 to 5 times; and optionally this is heat-treated at 180 to 255° C. for 1 to 60 seconds.

For reducing the difference in the thermal shrinkage between the machine direction and the transverse direction of the polyester film and for reducing the thermal shrinkage of the film in the machine direction, for example, preferably employed is a method of shrinking a film in the machine direction through thermal treatment as in JP-A 57-57628; or a method of thermal relaxation of a suspended film as in JP-A 1-275031.

[Polycarbonate]

Use of a polycarbonate film as the plastic film is described in detail hereinunder.

The polycarbonate to constitute a polycarbonate film may be a polycarbonate in which the bisphenol component is bisphenol A alone. For ensuring higher dimensional stability, the polycarbonate is preferably an aromatic polycarbonate comprising repetitive units of the following formula (1):

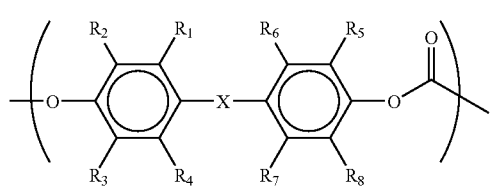

(1)

In the above formula (1), $R_1$ to $R_8$ each independently represent a hydrogen atom, a halogen atom, or a hydrocarbon group having from 1 to 6 carbon atoms. The halogen atom includes, for example, a fluorine atom, a chlorine atom, a bromine atom. The hydrocarbon group having from 1 to 6 carbon atoms includes, for example, a methyl group, an ethyl group. X represents a hydrocarbon group having from 1 to 15 carbon atoms. However, when $R_1$ to $R_8$ are hydrogen atoms, then X must not be an isopropylidene group. The hydrocarbon group having from 1 to 15 carbon atoms includes, for example, a propylidene group, a 1,1-cyclohexylidene group, a 3,3,5-trimethyl-1,1-cyclohexylidene group, a 9,9-fluoridene group.

For obtaining both further higher heat resistance and dimensional stability, the aromatic polycarbonate is preferably a copolycarbonate having repetitive units of a comonomer component of the following formula (2), (3), (4) or (5):

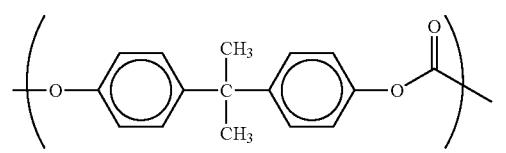

(2)

(3)

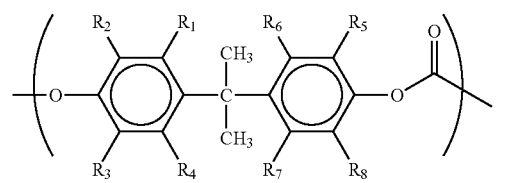

In the above formula (3), $R_1$ to $R_8$ each independently represent a hydrogen atom, a halogen atom, or a hydrocarbon group having from 1 to 6 carbon atoms. However, $R_1$ to $R_8$ must not be hydrogen atoms at the same time. An example of the repetitive unit of formula (3) is 3,3',5,5'-tetramethyl-bisphenol A.

(4)

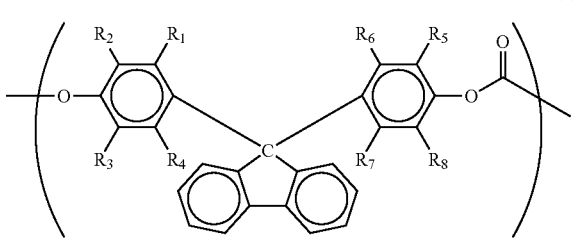

In the above formula (4), $R_1$ to $R_8$ each independently represent a hydrogen atom, a halogen atom, or a hydrocarbon group having from 1 to 6 carbon atoms. Examples of the repetitive unit of formula (4) are fluorene-9,9-di(4-phenol), fluorene-9,9-di(3-methyl-4-phenol).

(5)

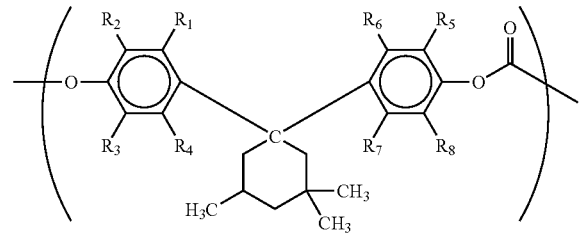

In the above formula (5), $R_1$ to $R_8$ each independently represent a hydrogen atom, a halogen atom, or a hydrocarbon group having from 1 to 6 carbon atoms. An example of the repetitive unit of formula (5) is 3,3,5-trimethyl-1,1-di(4-phenol)cyclohexylidene.

IN these copolycarbonates, the proportion of the repetitive units of formula (1) is preferably from 30 to 99 mol %, more preferably from 30 to 75 mol %. When smaller than 30 mol %, then it is unfavorable since the heat resistance of the polymer is poor. When larger than 99 mol %, then it is also unfavorable since the heat resistance and the dimensional stability of the polymer could not be improved.

Through extrapolation with an Ubbelohde viscometer, the degree of polymerization of the polycarbonate is measured in a solvent of methylene chloride at 20° C., and the limiting viscosity number [η] of the polymer is preferably from 0.15 to 1.0, more preferably from 0.25 to 0.7. When smaller than 0.15, then it is unfavorable since the polymer could not form a film having a sufficient strength. When larger than 1.0, it is also unfavorable since the polymer is difficult to shape.

The polycarbonate may be produced in any conventional known interfacial polymerization or melt polymerization method. The obtained polycarbonate may be formed into a polycarbonate film, for example, according to an extrusion-molding method or a solution-casting method. The solution-casting method is favorable since it gives films of good surface smoothness; and the extrusion-molding method is also favorable since its producibility is high.

For ensuring the long-term reliability of dye-sensitized solar cells, it is desirable that a gas barrier layer capable of preventing the penetration of oxygen and water into the film is provided on at least one surface of the polycarbonate film, and it is also desirable that a solvent-resistant layer such as a hard coat layer having a crosslinked structure is provided thereon.

For example, in case where a gas barrier layer is formed according to a wet coating method, any known coating material may be used as the material for the gas barrier layer, for example, polyvinyl alcohol or polyvinyl alcohol-based polymer such as polyvinyl alcohol-ethylene copolymer, or polyacrylonitrile or polyacrylonitrile-based polymer such as polyacrylonitrile-styrene copolymer, or polyvinylidene chloride.

For the coating, employable is any known coating method such as a reverse-roll coating method, a gravure-roll coating method, or a die coating method.

For improving the adhesiveness and the wettability thereof, the polycarbonate film may be processed for adhesive promotion of, for example, primer treatment.

(Transparent Conductive Layer)

The transparent conductive layer in the invention is a transparent electroconductive layer essentially comprising indium oxide, to which is added zinc oxide. The wording "essentially comprising indium oxide" means that indium oxide accounts for, for example, at least 50% by weight, preferably at least 70% by weight, more preferably at least 85% by weight per the overall weight, 100% by weight of the composition that constitutes the transparent conductive layer. In the invention, it is important that the essential ingredient of constituting the transparent conductive layer is indium oxide. If indium oxide is not used in the transparent conductive layer and if a thin metal film (e.g., thin film of platinum, gold, silver, copper or aluminium) or a thin carbon film is used, then the layer could not ensure sufficient light transmittance. In addition, when any other conductive metal oxide, such as fluorine-doped tin oxide is used, then its specific resistance is too high; and when the layer of the metal oxide is not formed to have a thickness of a few µm, then it could not ensure sufficient electroconductivity, and it may curl or crack on a plastic film that is not so strong as compared with the metal oxide, therefore resulting in the reduction in the electroconductivity of the layer and in the reduction in the reliability of the device.

Any other oxide may be added to indium oxide, thereby improving both the conductivity and the light transmittance of the mixed oxide. However, the most popular tin oxide-added indium-tin composite oxide (ITO) has some problems. It may form a layer on a polyester film at a low temperature and could be a film having a suitable surface resistivity, but its structure is an amorphous state or a mixed amorphous/crystalline state. The ITO film in that condition may undergo phase transition to a crystalline state at a temperature of 150° C. or so during thermal treatment in a process of fabricating the device. As a result, the internal stress may extremely increase inside the ITO film, whereby the film may be cracked and the reliability of the fabricated device may lower.

To solve the problems, in the invention, used is a transparent conductive material (IZO) of indium oxide with zinc oxide added thereto. The content of zinc oxide per 100% by weight of the composition to constitute the transparent conductive layer is preferably from 5 to 15% by weight, more preferably from 5 to 12.5% by weight, even more preferably from 7.5 to 10% by weight. Within the range, the conductive material may satisfy both good electroconductivity and transmittance, and may form a transparent conductive layer not undergoing crystal phase transition even under heat to be given thereto in a process of fabricating the device.

The surface resistivity of the transparent conductive layer in the invention is at most 40 Ω/square, preferably at most 15 Ω/square. When it is higher than 40 Ω/square, then the performance of the device could not be sufficiently improved. In order to reduce the surface resistivity to less than 1 Ω/square, the layer thickness must be increased and the layer may readily crack. Therefore, 1 Ω/square is the uppermost limit of the surface resistivity in practical use.

The surface tension of the transparent conductive layer in the invention is preferably at least 40 mN/m, more preferably at least 65 mN/m. When the surface tension is less than 40 mN/m, then it is unfavorable since the adhesiveness between the transparent conductive layer and the porous semiconductor layer to be formed thereon may be low. When the surface tension is at least 65 mN/m, then it is more favorable since a water-based coating liquid in which the essential ingredient of the solvent is water may be readily applied on the layer to form thereon a porous semiconductor layer.

The transparent conductive layer that satisfies the above-mentioned condition may be formed by disposing a composition to constitute the transparent conductive layer on a film and then processing the composition, for example, according to (1) a method of activating the surface of the transparent conductive layer with an acidic or alkaline solution, or (2) a method of irradiating the surface of the layer with UV rays or electron rays to activate it, or (3) a method of activating the surface of the layer through corona treatment or plasma treatment. Of those, the method of activating the surface of the layer through plasma treatment is especially favorable as it produces a high surface tension.

(Adhesive Layer)

For improving the adhesiveness between the plastic film and the transparent conductive layer, an adhesive layer is preferably provided between the plastic film and the transparent conductive layer. The thickness of the adhesive layer is preferably from 10 to 200 nm, more preferably from 20 to 150 nm. When the thickness of the adhesive layer is less than 10 nm, then it is unfavorable since the effect of the layer for improving the adhesiveness may be poor; but when more than 200 nm, then it is also unfavorable since the adhesive layer may readily undergo cohesive failure and its adhesiveness may lower.

Preferably, the adhesive layer is provided by coating in the process of producing the plastic film. In case where a polyester film is used as the plastic film, then it is desirable that the coating liquid for the adhesive layer is applied onto the polyester film before completion of the orientation crystallization of the film. The polyester film before completion of the orientation crystallization thereof includes an unstretched film, a monoaxially-oriented film formed by orienting an unstretched film in any one direction of the machine direction or the transverse direction, and a film prepared by orienting in two of machine and transverse directions both at a low stretching draw ratio (that is, a biaxially-stretched film that is not as yet finally re-stretched in the machine direction and in the transverse direction to complete the orientation crystallization of the thus-stretched film). Above all, it is desirable that an unstretched film or a monoaxially-stretched film oriented in one direction is coated with a water-base coating liquid of the above composition and the thus-coated film is directly stretched in the machine direction and/or in the transverse direction and then thermally fixed.

The constitutive material of the adhesive layer is a material that is highly adhesive to both the plastic film and the transparent conductive layer. Examples of the material highly adhesive to both a polyester film and the transparent conductive layer are a polyester resin, an acrylic resin, an urethane-acryl resin, a silicone-acryl resin, a melamine resin, a polysiloxane resin. One or more these resins may be used herein either singly or as combined.

[Physical Properties of Solar Cell Laminate]

According to the invention, a laminate for dye-sensitized solar cell having a total light transmittance of at least 75%, preferably at least 80% may be obtained. According to the invention, a laminate for dye-sensitized solar cell having a resistivity change before and after bending of from 0.8 to 1.2 may be obtained. Having these characteristics, the dye-sensitized solar cell that comprises the solar cell laminate of the invention as a part of the electrode thereof enables efficient photovoltaic power generation. The resistivity change may be represented by the following formula:

$$\text{Resistivity Change} = (\text{resistance after bending})/(\text{resistance before bending}).$$

The resistance before bending is a value obtained by measuring a laminate for dye-sensitized solar cell formed to have a width of 4 cm and a length of 15 cm. The resistance after bending is a value obtained by measuring a test sample after subjected to the following bending test repeatedly five times. The resistance is measured according to JIS K-7194.

The bending test is as follows: A 100-g weight is fitted to both ends of a laminate for dye-sensitized solar cell formed to have a width of 4 cm and a length of 15 cm. This is applied to a cylinder having a diameter of 10 cmφ and a length of 10 cm (the cylinder is so installed that its outer face is in parallel to the ground surface and is above the ground surface as spaced by at least 10 cm from it) in such a manner that its transparent conductive layer faces outside, and in that condition, this is kept suspended around the cylinder by its own weight for 5 minutes in an environment at a temperature of 25° C. and a humidity of 60% (in this case, the holding angle is 180 degrees), and thereafter this is left opened on a flat place for 5 minutes.

(Hard Coat Layer)

For improving the adhesiveness between the plastic film and the transparent conductive layer, especially for improving the adhesiveness durability therebetween, it is desirable that a hard coat layer is provided between the adhesive layer and the transparent conductive layer. Preferably, the hard coat layer is provided according to a method of applying a coating liquid for the layer onto the polyester film having the adhesive layer previously formed thereon. Preferably, the hard coat layer is formed of a material that exhibits good adhesiveness to both the adhesive layer and the transparent conductive layer. From the viewpoint of industrial producibility, the material is preferably a thermosetting resin, an energy ray-curable resin, an acrylic resin, an urethane resin, a silicone resin, an epoxy resin, or a mixture of the resin with inorganic particles such as alumina, silica, mica. The thickness of the hard coat layer is preferably from 0.01 to 20 μm, more preferably from 1 to 10 μm.

(Antireflection Layer)

The laminate for dye-sensitized solar cell of the invention may have an antireflection layer formed on the side opposite to the side of the transparent conductive layer on the plastic film, for the purpose of increasing the light transmittance through it to thereby increase the photovoltaic power generation efficiency of the fabricated cell. Preferably for the antireflection layer, a material having a different refractive index from that of the polyester film is laminated on the polyester film as a single layer or as a multi-layered structure of two or more layers. When the layer is a single layer, then it is desirable that its material has a smaller refractive index than that of the plastic film. When the layer is a multi-layered structure of two or more layers, then it is desirable that the layer adjacent to the laminate is formed of a material having a larger refractive index than that of the plastic film and the layer to overlie the above layer is formed of a material having a refractive index smaller than it.

The material to constitute the antireflection layer may be any one that satisfies the above-mentioned refractivity-related condition, irrespective of organic material and inorganic material. Its examples are $CaF_2$, $MgF_2$, $NaAlF_4$, $SiO_2$, $ThF_4$, $ZrO_2$, $Nd_2O_3$, $SnO_2$, $TiO_2$, $CeO_2$, $ZnS$, $In_2O_3$.

For forming the antireflection layer, for example, herein employable is a dry coating method such as a vacuum evaporation method, a sputtering method, a CVD method, an ion-plating method; or a wet coating method such as gravure coating method, a reverse coating method, die coating method. Prior to forming the antireflection layer thereon, if desired, the plastic film may be subjected to pretreatment of, for example, corona discharge treatment, plasma treatment, sputtering etching treatment, electron beam irradiation treatment, UV ray irradiation treatment, primer treatment, adhesiveness promotion treatment.

(Electrode for Dye-Sensitized Solar Cell)

The electrode for dye-sensitized solar cell of the invention is fabricated by forming a porous semiconductor layer on the transparent conductive layer of the above-mentioned laminate for dye-sensitized solar cell. The semiconductor to constitute the porous semiconductor layer may be an n-type semiconductor including titanium oxide ($TiO_2$), zinc oxide (ZnO), tin oxide ($SnO_2$). A composite semiconductor material prepared by combining these semiconductors may also be used herein.

The porous semiconductor layer has a structure of sintered or fused semiconductor particles, in which the mean particle size of the primary particle is preferably from 5 to 100 nm, more preferably from 5 to 50 nm. Two or more different types of particles having a different particle size distribution may be mixed for use herein, and for the purpose of scattering incident rays to thereby improve the light-trapping capability of the structure, semiconductor particles having a large particle size, for example, having a particle size of 300 nm or so may be mixed in the layer.

The particles to constitute the porous semiconductor layer may be prepared, for example, according to a known sol-gel process or a vapor phase thermal cracking process (see "Bases and Applications of Dye-Sensitized Solar Cells" issued by Technical Education Publishing in 2001, supervised by Shozo Yanagita; or "Thin-Film Coating Technology by Sol-Gel Method" issued by Technical Information Association in 1995).

Preferably, the porous semiconductor layer is formed according to a coating method. Specifically, it is desirable that the layer is formed according to a method that comprises applying a dispersion containing semiconductor particles onto the transparent conductive layer of a laminate, and then heating and drying it to thereby solidify a porous semiconductor layer on the transparent conductive layer. In this case, the dispersion of semiconductor particles may be prepared according to the above-mentioned sol-gel process or, apart from it, according to a method of precipitating particles in a solvent as a co-precipitated product through chemical reaction, or according to a method of dispersing particles by grinding them through ultrasonic irradiation or mechanical grinding.

The dispersant may be water or various organic solvents. In dispersing the particles, if desired, a small amount of a dispersion promoter, for example, a polymer such as polyethylene glycol, hydroxyethyl cellulose, carboxymethyl cellulose, or a surfactant, an acid or a chelating agent may be added to the system, and the resulting dispersion may be applied onto the transparent conductive layer of the laminate for dye-sensitized solar cell. For its application, employable is any conventional method generally used for coating, such as a roller method, a dipping method, an air knife method, a blade method, a wire bar method, a slide hopper method, an extrusion method, a curtain method. Also employable herein is a spin method or spray method with a general-purpose machine. For the coating, in addition, further employable are three typical printing methods of relief printing, offset printing or gravure printing, as well as wet printing methods of intaglio printing, rubber plate printing or screen printing. Depending on the liquid viscosity and the wet thickness, preferred methods may be selected.

For the purpose of enhancing the electronic contact of the semiconductor particles with each other in the thus-formed layer of semiconductor particles, and for improving the adhesiveness of the layer to the transparent conductive layer, it is desirable that the semiconductor layer is heated at 170 to 250° C., more preferably at 180 to 230° C., even more preferably at 190 to 220° C.

Specifically in the invention, it is desirable that a porous semiconductor layer of at least one oxide selected from titanium oxide, zinc oxide and tin oxide is formed on the transparent conductive layer and the porous semiconductor layer is baked at a temperature of 170 to 250° C. Thus baked, the resistance increase in the porous semiconductor layer may be reduced with preventing the deformation of the plastic film by heat. Further, the semiconductor particle layer may be heated by irradiating it with UV rays capable of being strongly absorbed by the particles, or by irradiating it with microwaves, whereby the physical bonding of the particles to each other may be strengthened.

The thickness of the coating layer of the dispersion of semiconductor particles may be, for example, from 1 to 30 μm, preferably from 2 to 10 μm. For the purpose of increasing the transparency thereof, the thickness of the layer is preferably from 2 to 6 μm. The coating amount of the semiconductor particles may be, for example, from 0.5 to 5 to 20 g, preferably from 5 to 10 g per m$^2$ of the plastic film.

For the purpose of preventing electric short-circuit between the porous semiconductor layer-having transparent conductive layer with a counter electrode, an undercoat layer may be previously formed on the transparent conductive layer. The undercoat layer is preferably $TiO_2$, $SnO_2$, ZnO, $Nb_2O_5$, more preferably $TiO_2$. The undercoat layer may be formed, for example, according to the spray pyrolysis process described in Electrochim, Acta 40, 643-652 (1995), or according to a puttering process. Preferably, the thickness of the undercoat layer is from 5 to 1000 nm, more preferably from 10 to 500 nm.

(Dye-Sensitized Solar Cell)

Using the electrode for dye-sensitized solar cell of the invention, a dye-sensitized solar cell may be fabricated, for example, according to the method mentioned below.

(1) A dye is absorbed by the porous semiconductor layer of the electrode for dye-sensitized solar cell of the invention. Briefly, a dye having the characteristic of absorbing light that falls within a visible light region and an IR ray region, for example, an organic metal complex dye such as typically a ruthenium/bipyridine complex (ruthenium complex), or a cyanine dye, a coumarin dye, a xanthene dye or a porphyrin dye, is dissolved in a solvent such as alcohol or toluene to prepare a dye solution, and the porous semiconductor layer is dipped in the solution, or the solution is sprayed or applied onto the porous semiconductor layer. (Electrode A)

(2) As a counter electrode, a thin platinum layer is formed on the side of the transparent conductive layer of the laminate of the invention according to a sputtering process. (Electrode B)

(3) The above electrode A and electrode B are put on top of one another via a heat-sealable polyethylene film frame-type spacer (thickness 20 μm) inserted therebetween, and the spacer is heated at 120° C. to thereby seal up the two electrodes. Further, the edges of the two are sealed up with an epoxy resin adhesive.

(4) Via a small hole for electrolytic solution injection therethrough that is previously provided at the corner of the sheet, an aqueous electrolyte solution that contains lithium iodide and iodine (3/2 by mol) and contains, as a spacer, 30% by weight of nylon beads having a mean particle size of 20 μm is injected into it. Its inner space is fully degassed, and finally the small hole is sealed up with an epoxy resin adhesive.

EFFECT OF THE INVENTION

According to the invention, there are provided a laminate for dye-sensitized solar cell and an electrode for dye-sensitized solar cell capable of producing highly-durable and flexible, dye-sensitized solar cells that have high photovoltaic power generation efficiency and are free from a problem of time-dependent photovoltaic power generation performance degradation.

INDUSTRIAL APPLICABILITY

The laminate for dye-sensitized solar cell of the invention is well workable and its interlayer adhesiveness is high, and the laminate is useful as a part of an electrode for dye-sensitized solar cell. Using it, a dye-sensitized solar cell having high photovoltaic power generation capability can be fabricated, and the industrial usefulness of the invention is great.

EXAMPLES

The invention is described in more detail with reference to the following Examples. The characteristic values were determined according to the methods mentioned below.

(1) Viscosity:

The intrinsic viscosity ([η] dl/g) of polyester was measured in an o-chlorophenol solution at 35° C. The limiting viscosity number ([η] dl/g) of polycarbonate was obtained through extrapolation with an Ubbelohde viscometer in a solvent of methylene chloride at 20° C.

(2) Film Thickness:

Using a micrometer (Anritsu's K-402B Model), a film was measured for its thickness at intervals of 10 cm both in the machine direction (continuous film formation direction) and in the transverse direction, at 300 points in all. The data at those 300 points were averaged and the resulting mean value is the film thickness.

(3) Thermal Shrinkage (200° C., 230° C.)

In an oven controlled at a temperature of 200° C. or 230° C., a film was kept under no strain for 10 minutes, and the dimensional change of the film before and after heat treatment was measured both in the machine direction (MD) and in the transverse direction (TD) of the film. The thermal shrinkage of the film is computed according to the following formula, in the machine direction (MD) and in the transverse direction (TD)

$$\text{Thermal Shrinkage \%} = ((L_0 - L)/L_0) \times 100,$$

wherein $L_0$ means the mark-to-mark distance before heat treatment; and L means the mark-to-mark distance after heat treatment.

(4) Thickness of Coating Layer:

A small piece of a film was buried in an epoxy resin (Refinetec's Epomount), and along with the resin in which it was buried, it was sliced up to have a thickness of 50 nm, using Reichert-Jung's Microtome 2050. The slice was observed with a transmission electronic microscope (LEM-2000) at an accelerating voltage or 100 kV and at a magnification power of 100,000, and the thickness of the coating layer was measured.

(5) Surface Resistivity:

Using a four-probe surface resistivity meter (Mitsubishi Chemical's Loresta GP), a film sample was measured at indefinite 5 points, and the data are averaged to be a typical surface resistivity value of the sample.

(6) Surface Tension:

Using a contact angle meter (Kyowa Interfacial Science's CA-X Model), the contact angle, $\theta_w$, $\theta_y$, of the transparent conductive layer of a film sample to water and methylene iodide, of which the surface tension is known, was measured at 25° C. and 50% RH. From the thus-measured data, the surface tension $\gamma_s$ of the transparent conductive layer was computed in the manner mentioned below.

The surface tension $\gamma_s$ of the transparent conductive layer is a sum of the dispersive component $\gamma_{sd}$ and the polar component $\gamma_{sp}$ thereof.

In other words, $$\gamma_s = \gamma_{sd} + \gamma_{sp} \quad (1).$$

From Young, $$\gamma_s = \gamma_{sw} + \gamma_w \times \cos\theta_w \quad (2)$$

$$\gamma_s = \gamma_{sy} + \gamma_y \times \cos\theta_y \quad (3)$$

wherein $\gamma_{sw}$ means the tension acting between the transparent conductive layer and water; $\gamma_{sy}$ means the tension acting between the transparent conductive layer and methylene iodide; $\gamma_w$ means the surface tension of water; and $\gamma_y$ means the surface tension of methylene iodide.

From Fowkes, $$\gamma_{sw} = \gamma_s + \gamma_w - 2 \times (\gamma_{sd} \times \gamma_{wd})^{1/2} - 2 \times (\gamma_{sp} \times \gamma_{wp})^{1/2} \quad (4)$$

$$\gamma_{sy} = \gamma_s + \gamma_y - 2 \times (\gamma_{sd} \times \gamma_{yd})^{1/2} - 2 \times (\gamma_{sd} \times \gamma_{yd})^{1/2} - 2 \times (\gamma_{sp} \times \gamma_{yp})^{1/2} \quad (5)$$

wherein $\gamma_{wd}$ means the dispersive component of the surface tension of water; $\gamma_{wp}$ means the polar component of the surface tension of water; $\gamma_{yd}$ means the dispersive component of the surface tension of methylene iodide; and $\gamma_{yp}$ means the polar component of the surface tension of methylene iodide.

The simultaneous equations 1 to 5 are solved to give the surface tension of the transparent conductive layer, $\gamma_s = \gamma_{sd} + \gamma_{sp}$. In this, the surface tension of water, $\gamma_w = 72.8$ mN/m; the surface tension of methylene iodide, $\gamma_y = 50.5$ mN/m; the dispersive component of the surface tension of water, $\gamma_{wd} = 21.8$ mN/m; the polar component of the surface tension of water, $\gamma_{wp} = 51.0$ mN/m; the dispersive component of the surface tension of methylene iodide, $\gamma_{yd}$, 49.5 mN/m; and the polar component of the surface tension of methylene iodide, $\gamma_{yp} = 1.3$ mN/m.

(7) Heat Resistance of Transparent Conductive Layer:

A plastic film with a transparent conductive layer formed thereon was heated in an oven at 220° C. for 60 minutes, and then cooled to room temperature. After cooled, the surface resistivity of the sample was measured at indefinite 10 points, and the data were averaged.

(8) Photovoltaic Power Generation Efficiency:

A dye-sensitized solar cell having a size of 25 mm² was fabricated. Through I-V measurement under 100 mW/cm² irradiation with AM 1.5 pseudo-sunlight, the open-circuit voltage, the short-circuit current density, the fill factor and the photovoltaic power generation efficiency of the cell were obtained. For the measurement, used was a spectral sensitivity meter, Bunkoh-Keiki's CEP-2000 Model. In consideration of the time-dependent change after the cell fabrication, the photovoltaic power generation was measured after the fabricated cell was left at a temperature of 23° C. and a humidity of 50% for 1000 hours.

(9) Linear Expansion Coefficient:

The linear expansion coefficient was measured in the machine direction and the transverse direction of the film, according to ASTM E831. Of the data thus measured in the machine direction and the transverse direction, the larger one was employed.

(10) Haze Change:

A sample film of which the haze had been previously measured was heated at a temperature of 150° C. for 10 minutes, and its haze after the heat treatment was measured. According to the following formula, the haze change was computed.

Haze Change (%)=(haze after heat treatment−haze before heat treatment)/(haze before heat treatment).

The haze was measured according to ASTM D1003, using Nippon Denshoku's NDH-2000.

(12) Total Light Transmittance:

Using Nippon Denshoku's NDH-2000, the total light transmittance was measured according to ASTM D1003.

(13) Resistivity change before and after bending:

The resistivity change before and after bending was computed according to the following formula:

Resistivity change=(resistance after bending)/(resistance before bending).

The resistance before bending is as follows: A laminate for dye-sensitized solar cell formed to have a width of 4 cm and a length of 15 cm was measured for its resistance before bending. The resistance after bending is as follows: The laminate was subjected to the following bending test repeatedly five times, and thereafter it was measured for its resistance. The resistance was measured according to JIS K-7194.

Bending Test:

A 100-g weight is fitted to both ends of a laminate for dye-sensitized solar cell formed to have a width of 4 cm and a length of 15 cm. This is applied to a cylinder having a diameter of 10 cmφ and a length of 10 cm (the cylinder is so installed that its outer face is in parallel to the ground surface and is above the ground surface as spaced by at least 10 cm from it) in such a manner that its transparent conductive layer faces outside, and in that condition, this is kept suspended around the cylinder by its own weight for 5 minutes in an environment at a temperature of 25° C. and a humidity of 60% (in this case, the holding angle is 180 degrees), and thereafter this is left opened on a flat place for 5 minutes.

Example 1

Formation of Polymer for Film 100 parts of dimethyl naphthalene-2,6-dicarboxylate and 60 parts of ethylene glycol were interesterified for 120 minutes with 0.03 parts of manganese acetate tetrahydrate serving as an interesterification catalyst, with gradually elevating its temperature from 150° C. to 238° C. When the reaction temperature reached 170° C. in the course of the reaction, 0.024 parts of antimony trioxide was added to it, and after the transesterification reaction, trimethyl phosphate (the ester solution subjected to heat treatment in ethylene glycol at 135° C. under a pressure of from 0.11 to 0.16 MPa for 5 hours, and its trimethyl phosphate content is 0.023 parts) was added to it. Next, the reaction product was transferred into a polymerization reactor, heated up to 290° C., and subjected to polycondensation at a high vacuum of at most 27 Pa, thereby obtaining polyethylene-2,6-naphthalenedicarboxylate having an intrinsic viscosity of 0.63 dl/g and not substantially containing particles.

<Formation of Polyester Film>

The polyethylene-2,6-naphthalenedicarboxylate pellets were dried at 170° C. for 6 hours, then fed into an extruder hopper, melted at a melting temperature of 305° C., then filtered through a stainless steel fine-mesh filter having a mean opening of 17 μm, extruded out through a 3-mm slit die onto a rotary chill drum having a surface temperature of 60° C., and rapidly cooled thereon to obtain an unstretched film. The unstretched film was preheated at 120° C., then further heated between low-speed and high-speed rolls with an IR heater at 850° C. disposed above it by 15 mm, thereby stretched by 3.2 times in the machine direction (MD) to be an MD-stretched film. Using a roll coater, a coating agent A prepared according to the method mentioned below was applied on one surface of the MD-stretched film in order that the thickness of the coating layer could be 0.15 μm after dried, thereby forming an adhesive layer thereon. Next, this was led into a tenter, in which it was stretched at 140° C. in the transverse direction by 3.3 times. The obtained, biaxially-stretched film was heat-set at a temperature for 243° C. for 5 seconds to obtain a polyester film having an intrinsic viscosity of 0.59 dl/g and a thickness of 125 μm. Next, while suspended, the polyester film was thermally relaxed at a degree of relaxation of 0.8%, at a temperature of 205° C. Treated at 200° C. for 10 minutes, the thermal shrinkage of the polyester film in the machine direction was 0.15%; and the thermal shrinkage thereof in the transverse direction was 0.05%. Treated at 230° C. for 10 minutes, the thermal shrinkage of the film in the machine direction was 1.78%. The linear expansion coefficient of the polyester film was 22 ppm/° C.; and the total light transmittance thereof was 86%.

<Preparation of Coating Agent A>

In a four-neck flask, 3 parts of sodium laurylsulfonate serving as a surfactant and 181 parts of ion-exchanged water were put, and heated in a nitrogen atmosphere up to 60° C., and, as a polymerization initiator, 0.5 parts of ammonium persulfate and 0.2 parts of sodium hydrogen-nitrite, and, as a mixture of monomers, δ0.1 parts of methyl methacrylate, 21.9 parts of 2-isopropenyl-2-oxazoline, 39.4 parts of polyethylene oxide (n=10) methacrylate and 8.6 parts of acrylamide were dropwise added to it, taking 3 hours while the liquid temperature was controlled to fall between 60 and 70° C. After the addition, this was kept at a temperature falling within that range for 2 hours, and the reaction was continued with stirring, and then this was cooled to obtain an aqueous acrylic dispersion having a solid content of 35% by weight.

On the other hand, an aqueous solution was prepared, containing 0.2% by weight of a silica filler (mean particle size; 100 nm, Nissan Chemical's Snowtex ZL) and 0.3% by weight of a wetting agent, polyoxyethylene (n=7) lauryl ether (Sanyo Chemical's Nanoacty N-70).

15 parts by weight of the aqueous acrylic dispersion and 85 parts by weight of the aqueous solution were mixed to prepare a coating agent A.

<Formation of Hard Coat Layer>

The polyester film obtained according to the above-mentioned method was used. An UV-curable hard coating agent (JSR's Desolight R7501) was applied to the polyester film on the side of the adhesive layer thereof to form a coating layer having a thickness of about 5 μm, and then UV-cured to from a hard coat layer thereon, thereby producing a hard coat layer-having polyester film.

<Formation of Transparent Conductive Layer>

According to a direct-current magnetron sputtering process using an IZO target that comprises essentially indium oxide and contains 7.5% by weight of zinc oxide added thereto, a transparent conductive layer of IZO having a thickness of 260 nm was formed on the hard coat layer of the hard coat layer-having polyester film. The formation of the transparent conductive layer through sputtering was as follows: Before plasma discharge, the inside of the chamber was degassed to a degree of $5 \times 10^{-4}$ Pa, then argon and oxygen were introduced into the chamber and the pressure was increased up to 0.3 Pa. A power was applied to the IZO target at a current density of 2 W/cm². The oxygen partial pressure was 3.7 mPa. The surface resistivity of the thus-formed transparent conductive layer was 14 Ω/square.

Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The obtained laminate for dye-sensitized solar cell had a surface resistivity of 14.5 Ω/square, a total light transmittance of 81%, and a surface tension of 72.3 mN/m. The heat resistance of the transparent conductive layer was assessed. After heated, the surface resistivity of the layer was 16 Ω/square, and this confirms that the increase in the surface resistivity of the layer is small.

<Formation of Antireflection Layer>

On the side opposite to the side of the transparent conductive layer of the laminate for dye-sensitized solar cell, formed were an $Y_2O_3$ layer having a thickness of 75 nm and a refractive index of 1.89, a $TiO_2$ layer having a thickness of 120 nm and a refractive index of 2.3, and an $SiO_2$ layer having a thickness of 90 nm and a refractive index of 1.46 in that order, both according to a high-frequency sputtering process, thereby serving as an antireflection layer. In forming the layers, the vacuum degree was $1 \times 10^{-3}$ Torr; and an atmosphere of Ar: 55 sccm and $O_2$: 5 sccm was used. In the process of forming the antireflection layer, the polyester film was neither heated nor cooled, and was kept at room temperature. Thus obtained, the antireflection layer-coated laminate for dye-sensitized solar cell had a total light transmittance of 80%, and its resistivity change before and after bending was 0.96.

<Formation of Porous Semiconductor Layer>

On the transparent conductive layer of the antireflection layer-coated laminate for dye-sensitized solar cell, a commercially-available, cold-working, porous titanium dioxide layer-forming paste (Showa Denko's SP-200) was applied, using a bar coater, and then heated in air at 200° C. for 60 minutes, thereby forming thereon a porous titanium dioxide layer, or that is, a porous semiconductor layer having a thickness of 3 μm, and an electrode for dye-sensitized solar cell was thus formed.

<Fabrication of Dye-Sensitized Solar Cell>

The electrode for dye-sensitized solar cell was dipped in an ethanol solution of 300 μM ruthenium complex ((Ru535bisTBA, by Solaronix) for 24 hours, whereby the ruthenium complex was adsorbed by the electrode surface to fabricate a working electrode.

On the other hand, on the transparent conductive layer of the electrode for dye-sensitized solar cell produced in the previous section, a Pt film was deposited according to a sputtering process, thereby forming a counter electrode.

The working electrode and the counter electrode were put on top of one another via a heat-sealable polyethylene film frame-type spacer (thickness 20 μm) inserted therebetween, and the spacer was heated at 120° C. to thereby seal up the two electrodes. Further, the edges of the two were sealed up with an epoxy resin adhesive. An electrolyte solution (3-methoxypropionitrile solution containing 0.5 M lithium iodide, 0.05 M iodine, 0.5 M tert-butylpyridine, and 3% by weight of nylon beads having a mean particle size of 20 μm) was injected into it, and seated up with an epoxy adhesive to obtain a dye-sensitized solar cell.

The obtained, dye-sensitized solar cell was kept at a temperature of 23° C. and a humidity of 50% for 1000 hours, and then subjected to I-V measurement (effective area, 25 mm$^2$). The open-circuit voltage, the short-circuit current density and the fill factor of the cell were 0.74 V, 7.9 mA/cm$^2$ and 0.69, respectively, and, as a result, the photovoltaic power generation efficient of the cell was 4.0%.

Example 2

A hard coat layer-having polyester film was produced in the same manner as in Example 1, for which, however, the stretching condition of the polyester film was changed as in Table 1. On the hard coat layer, formed was a transparent conductive layer of IZO having a thickness of 130 nm, according to a direct-current magnetron sputtering process using an IZO target that comprises essentially indium oxide and contains 7.5% by weight of zinc oxide added, thereto. The formation of the transparent conductive layer through sputtering was as follows: Before plasma discharge, the inside of the chamber was degassed to a degree of 5×10$^{-4}$ Pa, then argon and oxygen were introduced into the chamber and the pressure was increased up to 0.3 Pa. A power was applied to the IZO target at a current density of 2 W/cm$^2$. The oxygen partial pressure was 3.7 mPa. The surface resistivity of the transparent conductive layer was 28 Ω/square. Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The obtained laminate for dye-sensitized solar cell had a surface resistivity of 28 Ω/square, a total light transmittance of 81%, and a surface tension of 71.7 mN/m, and its resistivity change before and after bending was 1.03. The heat resistance of the transparent conductive layer was assessed. After heated, the surface resistivity of the layer was 30 Ω/square, and this confirms that the increase in the surface resistivity of the layer is small.

As in Example 1, an electrode for dye-sensitized solar cell and a dye-sensitized solar cell were produced. The cell was subjected to I-V measurement (effective area, 25 mm$^2$). The open-circuit voltage, the short-circuit current density and the fill factor of the cell were 0.75 V, 7.3 mA/cm$^2$ and 0.62, respectively, and, as a result, the photovoltaic power generation efficiency of the cell was 3.4%.

Example 3 and Comparative Example 1

A laminate for dye-sensitized solar cell, an electrode for dye-sensitized solar cell, and a dye-sensitized solar cell were produced in the same manner as in Example 2, for which, however, the stretching condition of the polyester film was changed as in Table 1. The thermal shrinkage in the machine direction and the linear expansion coefficient of the polyester film were as in Table 1. The total light transmittance and the resistivity change before and after bending of the laminate for dye-sensitized solar cell were as in Table 1. The photovoltaic power generation efficiency of the dye-sensitized solar cell was as in Table 1.

Example 4

Formation of Polycarbonate Film 284 parts by weight of 3,3',5,5'-tetramethylbisphenol A and 225 parts by weight of DPC were polymerized through de-phenolation, using 0.2 parts by weight of sodium salt of bisphenol A as a catalyst, in a nitrogen atmosphere at 200 to 280° C., thereby obtaining a homopolymer of 3,3',5,5'-tetramethylbisphenol A. The limiting viscosity number of the polymer was 0.35. The polymer was dissolved in methylene chloride to prepare a 22 wt. % solution. The obtained solution was cast onto a polyester film according to a die coating process, and then dried at 100° C. for 10 minutes to thereby form a polycarbonate film having a thickness of 120 μm.

After treated at 200° C. for 10 minutes, the thermal shrinkage of the polycarbonate film in the machine direction thereof was −0.98%; and the thermal shrinkage thereof in the transverse direction was −0.97%. After treated at 230° C. for 10 minutes, the thermal shrinkage of the film in the machine direction was −1.11%. The linear expansion coefficient of the polycarbonate film was 58 ppm/° C.; and the total light transmittance thereof was 92%.

<Formation of Hard Coat Layer>

Using a roll coater, the coating liquid A mentioned above was applied to the obtained polycarbonate film to form an adhesive layer thereon. A hard coat layer was formed on the adhesive layer to obtain a hard coat layer-having polycarbonate film. For forming the hard coat layer, used was a coating liquid prepared by mixing 50 parts by weight of Kyoeisha Chemical's Lightacrylate DCP-A, 50 parts by weight of 1-methoxy-2-propanol, 3.5 parts by weight of Ciba-Geigy's Irgacure 184, and 0.02 parts by weight of Toray Dow Corning's SH28PA. The hard coat layer was formed as follows: Using a bar coater, the coating liquid was applied onto the adhesive layer, heated at 60° C. for 1 minute to thereby evaporate away the residual solvent in the coating film, and then irradiated with UV rays under an irradiation condition of 700 mJ/cm$^2$, using a high-pressure mercury lamp of 160 W/cm, to thereby cure the coating film, and a hard coat layer having a thickness of 4.5 μm was thus formed.

<Formation of Transparent Conductive Layer>

In the same manner as in Example 1, a transparent conductive layer of IZO having a thickness of 260 nm was formed on the hard coat layer of the hard coat layer-having polycarbonate film, according to a direct-current magnetron sputtering process using an IZO target that comprises essentially indium oxide and contains 7.5% by weight of zinc oxide added thereto. The surface resistivity of the transparent conductive layer was 14 Ω/square. Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The transparent conductive layer of the obtained laminate for dye-sensitized solar cell had a surface resistivity of 14.5 Ω/square, a total light transmittance of 89%, and a surface tension of 72.0 mN/m. The heat resistance of the transparent conductive layer was assessed. After heated, the surface resistivity of the layer was 15 Ω/square, and this confirms that the increase in the surface resistivity of the layer is small.

<Formation of Antireflection Layer>

In the same manner as in Example 1, an antireflection layer having a thickness of 60 nm was formed on the above laminate for dye-sensitized solar cell, thereby obtaining a antireflection layer-coated laminate for dye-sensitized solar cell. The total light transmittance of the obtained laminate for dye-sensitized solar cell was 84%, and the resistivity change thereof before and after bending was 1.02.

<Formation of Porous Semiconductor Layer>

In the same manner as in Example 1, a porous semiconductor layer was formed on the antireflection layer-coated laminate for dye-sensitized solar cell, thereby obtaining an electrode for dye-sensitized solar cell.

<Fabrication of Dye-Sensitized Solar Cell>

Using the obtained electrode for dye-sensitized solar cell, a dye-sensitized solar cell was fabricated in the same manner as in Example 1. The completed dye-sensitized solar cell was kept at a temperature of 23° C. and a humidity of 50% for 1000 hours, and then subjected to I-V measurement (effective area, 25 mm$^2$). The open-circuit voltage, the short-circuit current density and the fill factor of the cell were 0.74 V, 7.9 mA/cm$^2$ and 0.69, respectively, and the photovoltaic power generation efficient of the cell was 4.0

Example 5

In the same manner as in Example 4, a hard coat layer-having polycarbonate film was formed. On the hard coat layer, formed was a transparent conductive layer of IZO having a thickness of 130 nm, according to a direct-current magnetron sputtering process using an IZO target that comprises essentially indium oxide and contains 7.5% by weight of zinc oxide added thereto. The formation of the transparent conductive layer through sputtering was as follows: Before plasma discharge, the inside of the chamber was degassed to a degree of 5×10$^{-4}$ Pa, then argon and oxygen were introduced into the chamber and the pressure was increased up to 0.3 Pa. A power was applied to the IZO target at a current density of 2 W/cm$^2$. The oxygen partial pressure was 3.7 mPa. The surface resistivity of the transparent conductive layer was 28 Ω/square. Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The obtained laminate for dye-sensitized solar cell had a surface resistivity of 27 Ω/square, a total light transmittance of 91%, a total light transmittance of 87%, a resistivity change before and after bending of 1.02, and a surface tension of 71.6 mN/m. The heat resistance of the transparent conductive layer was assessed. After heated, the surface resistivity of the layer was 28 Ω/square, and this confirms that the increase in the surface resistivity of the layer is small.

In the same manner as in Example 4, a porous semiconductor layer was formed on the laminate for dye-sensitized solar cell thereby producing an electrode for dye-sensitized solar cell, and using it, a dye-sensitized solar cell was fabricated. The completed dye-sensitized solar cell was kept at a temperature of 23° C. and a humidity of 50% for 1000 hours, and then subjected to I-V measurement (effective area, 25 mm$^2$). The open-circuit voltage, the short-circuit current density and the fill factor of the cell were 0.76 V, 7.8 mA/cm$^2$ and 0.65, respectively, and the photovoltaic power generation efficient of the cell was 3.9%.

Example 6

A commercially-available polyether sulfone film (Sumitomo Bakelite's SUMILITE® FS-5300, 120 μm) was previously subjected to thermal relaxation treatment at 230° C. for 1 hour. After the relaxation treatment, the film was then treated at 200° C. for 10 minutes, and its thermal shrinkage in the machine direction was −0.92%, and the thermal shrinkage thereof in the transverse direction was −0.94%. When treated at 230° C. for 10 minutes, the thermal shrinkage of the film was −1.12%. The linear expansion coefficient of the film was 54 ppm/° C., and the total light transmittance thereof was 86%.

In the same manner as in Example 4, an adhesive layer and a hard coat layer were formed in that order on the film to produce a hard coat layer-having polyether sulfone film. Also in the same manner as in Example 4, a transparent conductive layer was formed on it. The surface resistivity of the thus-formed transparent conductive layer was 14 Ω/square. Next, in the same manner as in Example 4, the surface of the transparent conductive layer was subjected to plasma treatment to produce a laminate for dye-sensitized solar cell. The surface resistivity of the transparent conductive layer of the thus-obtained laminate for dye-sensitized solar cell was 14.3 Ω/square; the total light transmittance thereof was 84%; and the surface tension thereof was 72.0 mN/m. The heat resistance of the transparent conductive layer was assessed. After heated, the surface resistivity of the layer was 14.5 Ω/square, and this confirms that the increase in the surface resistivity of the layer is small.

In the same manner as in Example 4, an antireflection layer was formed on the laminate for dye-sensitized solar cell. The total light transmittance of the thus-obtained, antireflection layer-coated laminate for dye-sensitized solar cell was 86%; and the resistivity change thereof before and after bending was 0.98.

In the same manner as in Example 4, a porous semiconductor layer was formed on the transparent conductive layer of the antireflection layer-coated laminate for dye-sensitized solar cell thereby producing an electrode for dye-sensitized solar cell. Using it, a dye-sensitized solar cell was fabricated in the same manner as in Example 1. The completed dye-sensitized solar cell was kept at a temperature of 23° C. and a humidity of 50% for 1000 hours, and then subjected to I-V measurement (effective area, 25 mm$^2$). The open-circuit voltage, the short-circuit current density and the fill factor of the cell were 0.74 V, 7.9 mA/cm$^2$ and 0.69, respectively, and the photovoltaic power generation efficient of the cell was 4.0%.

Example 7

A commercially-available amorphous polyolefin film (Nippon Zeon's Zeonoa Film ZF-14, 100 μm) was previously subjected to thermal relaxation treatment at 230° C. for 1 hour. After the thermal relaxation treatment, the film was then treated at 200° C. for 10 minutes, and its thermal shrinkage in the machine direction was −1.13%, and the thermal shrinkage thereof in the transverse direction was −1.15%. When treated at 230° C. for 10 minutes, the thermal shrinkage of the film was −1.34%. The linear expansion coefficient of the film was 68 ppm/° C., and the total light transmittance thereof was 86%.

In the same manner as in Example 4, an adhesive layer and a hard coat layer were formed in that order on the film to produce a hard coat layer-having polyether sulfone film. Also in the same manner as in Example 4, a transparent conductive layer was formed on the hard coat layer-having polyether sulfone film. The surface resistivity of the transparent conductive layer was 14.3 Ω/square. Next, in the same manner as in Example 4, the surface of the transparent conductive layer was subjected to plasma treatment to produce a laminate for dye-sensitized solar cell. The surface resistivity of the obtained laminate for dye-sensitized solar cell was 14.4 Ω/square; the total light transmittance thereof was 87%; and the surface tension thereof was 72.0 mN/m. The heat resistance of the transparent conductive layer was assessed. After heated, the surface resistivity of the layer was 14.5 Ω/square, and this confirms that the increase in the surface resistivity of the layer is small.

In the same manner as in Example 4, an antireflection layer was formed on the laminate for dye-sensitized solar cell, thereby obtaining an antireflection layer-coated laminate for dye-sensitized solar cell. The total light transmittance of the laminate was 90%; and the resistivity change thereof before and after bending was 0.98.

In the same manner as in Example 4, a porous semiconductor layer was formed on the laminate for dye-sensitized solar cell thereby producing an electrode for dye-sensitized solar cell. Using it, a dye-sensitized solar cell was fabricated in the same manner as in Example 1. The completed dye-sensitized solar cell was kept at a temperature of 23° C. and a humidity of 50% for 1000 hours, and then subjected to I-V measurement (effective area, 25 mm$^2$). The open-circuit voltage, the short-circuit current density and the fill factor of the cell were 0.72 V, 7.7 mA/cm$^2$ and 0.68, respectively, and the photovoltaic power generation efficient of the cell was 4.1%.

Comparative Example 2

A hard coat layer-having polyester film was produced in the same manner as in Example 2. According to a direct-current magnetron sputtering process using an ITO target that comprises essentially indium oxide and contains 10% by weight of tin oxide added thereto, a transparent conductive layer of ITO having a thickness of 170 nm was formed on the hard coat layer. The formation of the transparent conductive layer through sputtering was as follows: Before plasma discharge, the inside of the chamber was degassed to a degree of 5×10$^{-4}$ Pa, then argon, and oxygen were introduced into the chamber and the pressure was increased up to 0.3 Pa. A power was applied to the ITO target at a current density of 2 W/cm$^2$. The oxygen partial pressure was 4.2 mPa. The surface resistivity of the transparent conductive layer was 30 Ω/square.

Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The obtained laminate for dye-sensitized solar cell had a surface resistivity of 31 Ω/square, a total light transmittance of 85%, and a surface tension of 72.1 mN/m. The heat resistance of the transparent conductive layer was assessed. After heated, the surface resistivity of the layer was 62 Ω/square, and this confirms that the increase in the surface resistivity of the layer is great. Measuring the resistivity change before and after bending of the laminate for dye-sensitized solar cell was tried but in vain, since the transparent conductive layer of the laminate for dye-sensitized solar cell cracked.

Using the laminate for dye-sensitized solar cell, an electrode for dye-sensitized solar cell and a dye-sensitized solar cell were fabricated in the same manner as in Example 2. The cell was subjected to I-V measurement (effective area, 25 mm$^2$). As a result, the open-circuit voltage, the short-circuit current density and the fill factor of the cell were 0.65 V, 7.1 mA/cm$^2$ and 0.48, respectively, and the photovoltaic power generation efficient of the cell was 2.2%.

Comparative Example 3

A hard coat layer-having polycarbonate ester film was produced in the same manner as in Example 4. In the same manner as in Comparative Example 2, a transparent conductive layer of ITO was formed on the film. The surface resistivity of the transparent conductive layer was 31 Ω/square. Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The obtained laminate for dye-sensitized solar cell had a surface resistivity of 31 Ω/square, a total light transmittance of 85%, and a surface tension of 72.1 mN/m. The heat resistance of the transparent conductive layer was assessed. After heated, the surface resistivity of the layer was 500 Ω/square or more, and it was confirmed that not only the surface resistivity increase was large but also the transparent conductive film cracked. This indicates that the laminate could not be used for an electrode for dye-sensitized solar cell.

Comparative Example 4

A commercially-available polyether sulfone film (Sumitomo Bakelite's SUMILITE® FS-5300, 120 μm) was previously subjected to thermal relaxation treatment at 230° C. for 1 hour. In the same manner as in Example 4, the film was processed to give a hard coat layer-having polyether sulfone film. On the film, a transparent conductive layer of ITO was formed in the same manner as in Comparative Example 2. The surface resistivity of the transparent conductive layer was 30 Ω/square. Next, using a normal-pressure plasma surface treatment device (Sekisui Chemical Industry's AP-T03-L), the surface of the transparent conductive layer was subjected to plasma treatment in a nitrogen atmosphere (60 L/min), at 1 m/min, thereby obtaining a laminate for dye-sensitized solar cell. The obtained laminate for dye-sensitized solar cell had a surface resistivity of 31 Ω/square, a total light transmittance of 85%, and a surface tension of 71.9 mN/m. The heat resistance of the transparent conductive layer was assessed. After heated, the surface resistivity of the layer was 500 Ω/square or more, and it was confirmed that not only the surface resistivity increase was large but also the transparent conductive film cracked. This indicates that the laminate could not be used for a cell electrode.

TABLE 1

| | | Example 2 | Example 3 | Comparative Example 1 |
|---|---|---|---|---|
| Polyester Film | MD Stretching Draw Ratio | 3.2 | 3.4 | 3.4 |
| | TD Stretching Draw Ratio | 3.3 | 3.5 | 3.5 |
| | Thermal Fixation Temperature, ° C. | 243 | 240 | 237 |
| | Thermal Relaxation Temperature, ° C. | 205 | 205 | 205 |
| | Thermal Relaxation rate % | 0.8 | 0.7 | 0.6 |

TABLE 1-continued

|  |  |  | Example 2 | Example 3 | Comparative Example 1 |
|---|---|---|---|---|---|
|  | Thermal Shrinkage, %, heated at 200° C. for 10 minutes | MD | 0.15 | 0.42 | 0.57 |
|  |  | TD | 0.05 | 0.25 | 0.46 |
|  | Thermal Shrinkage, %, heated at 230° C. for 10 minutes | MD | 1.78 | 2.05 | 2.28 |
|  |  | TD | 1.56 | 1.93 | 2.11 |
|  | Linear Expansion Coefficient, ppm |  | 22 | 22 | 24 |
| Laminate for Dye-Sensitized Solar Cell | Total Light Transmittance |  | 81 | 80 | 78 |
|  | Resistivity Change before and after bending |  | 1.03 | 1.02 | 2.27 |
| Dye-Sensitized Solar Cell | Photovoltaic Power Generation Efficiency, % |  | 3.4 | 3 | 2.4 |

The invention claimed is:

1. A laminate for a dye-sensitized solar cell comprising a plastic film of which the thermal shrinkage in the machine direction thereof when heat-treated at 200° C. for 10 minutes is from +0.15 to +0.5%, and a transparent conductive layer provided on the film, which comprises essentially indium oxide with zinc oxide added thereto in an amount of 5 to 15% by weight based on the transparent conductive layer and has a surface resistivity of at most 40 Ω/square;
   wherein the thermal shrinkage in the machine direction of the plastic film when heated at 230° C. for 10 minutes is from −2.0 to 2.0%;
   wherein the plastic film is a polyethylene-2,6-naphthalate film.

2. The laminate for a dye-sensitized solar cell as claimed in claim 1, wherein the linear expansion coefficient of the plastic film is at most 100 ppm/° C.

3. The laminate for a dye-sensitized solar cell as claimed in claim 1, wherein the haze change of the plastic film when heated at a temperature of 150° C. for 10 minutes is at most 5%.

4. The laminate for a dye-sensitized solar cell as claimed in claim 1, wherein the total light transmittance of the laminate for a dye-sensitized solar cell is at least 75%.

5. The laminate for a dye-sensitized solar cell as claimed in claim 1, wherein the resistivity change before and after bending of the laminate for a dye-sensitized solar cell is from 0.8 to 1.2.

6. The laminate for a dye-sensitized solar cell as claimed in claim 1, wherein the surface tension of the transparent conductive layer of the laminate for a dye-sensitized solar cell is at least 40 mN/m.

7. The laminate for a dye-sensitized solar cell as claimed in claim 1, which additionally has an adhesive layer having a thickness of from 10 to 200 nm between the plastic film and the transparent conductive layer.

8. The laminate for a dye-sensitized solar cell as claimed in claim 7, which additionally has a hard coat layer between the adhesive layer and the transparent conductive layer.

9. The laminate for a dye-sensitized solar cell as claimed in claim 1, which additionally has an antireflection layer on the side opposite to the side of transparent conductive layer on the plastic film.

10. An electrode for a dye-sensitized solar cell comprising a laminate for a dye-sensitized solar cell of claim 1, and a porous semiconductor layer formed on the transparent conductive layer of the laminate and comprising at least one oxide selected from a group consisting of titanium oxide, zinc oxide and tin oxide.

11. A method for producing an electrode for a dye-sensitized solar cell, which comprises forming a porous semiconductor layer comprising at least one oxide selected from a group consisting of titanium oxide, zinc oxide and tin oxide, on the transparent conductive layer of a laminate for a dye-sensitized solar cell of claim 1, and baking the porous semiconductor at a temperature of from 170 to 250° C.

* * * * *